United States Patent [19]

Wilmes et al.

[11] 4,175,820

[45] Nov. 27, 1979

[54] MODULAR HOUSING MEANS FOR ELECTRICAL AND ELECTRONIC COMPONENTS

[75] Inventors: Manfred Wilmes, Detmold; Torsten Finger, Lemgo; Arno Fitzler, Herford; Wolfgang Kretzschmar; Heinrich Franke, both of Detmold, all of Fed. Rep. of Germany

[73] Assignee: C. A. Weidmuller KG, Detmold, Fed. Rep. of Germany

[21] Appl. No.: 842,828

[22] Filed: Oct. 17, 1977

[30] Foreign Application Priority Data

Oct. 15, 1976 [DE] Fed. Rep. of Germany ....... 2646616

[51] Int. Cl.² .......................... H01R 9/10; H01R 9/16
[52] U.S. Cl. ............................ 339/198 R; 339/198 G; 339/198 K
[58] Field of Search ........... 339/198 R, 198 C, 198 G, 339/198 GA, 198 H, 198 J, 198 K, 198 S, 198 P, 198 N, 198 M, 272 R, 272 A; 361/393-395, 399

[56] References Cited

U.S. PATENT DOCUMENTS

| 2,777,893 | 1/1957 | De Rosso | 361/399 |
| 3,176,260 | 3/1965 | Pascucci | 339/128 |
| 3,675,181 | 7/1972 | Lankford et al. | 339/272 R |
| 3,833,839 | 9/1974 | Debaigt | 339/198 G |
| 4,006,323 | 2/1977 | Nelson et al. | 339/272 A |

FOREIGN PATENT DOCUMENTS

| 1765973 | 8/1971 | Fed. Rep. of Germany . | |
| 1345089 | 10/1963 | France | 339/198 GA |
| 1193399 | 5/1970 | United Kingdom | 339/198 GA |
| 1246943 | 9/1971 | United Kingdom | 339/198 GA |
| 1275229 | 5/1972 | United Kingdom | 339/198 GA |

*Primary Examiner*—Neil Abrams
*Attorney, Agent, or Firm*—Pollock, Vande Sande & Priddy

[57] ABSTRACT

A modular frame-like housing for electrical and electronic components is provided with plug-in and unpluggable interchangeable terminal units for connecting said components to external leads.

9 Claims, 1 Drawing Figure

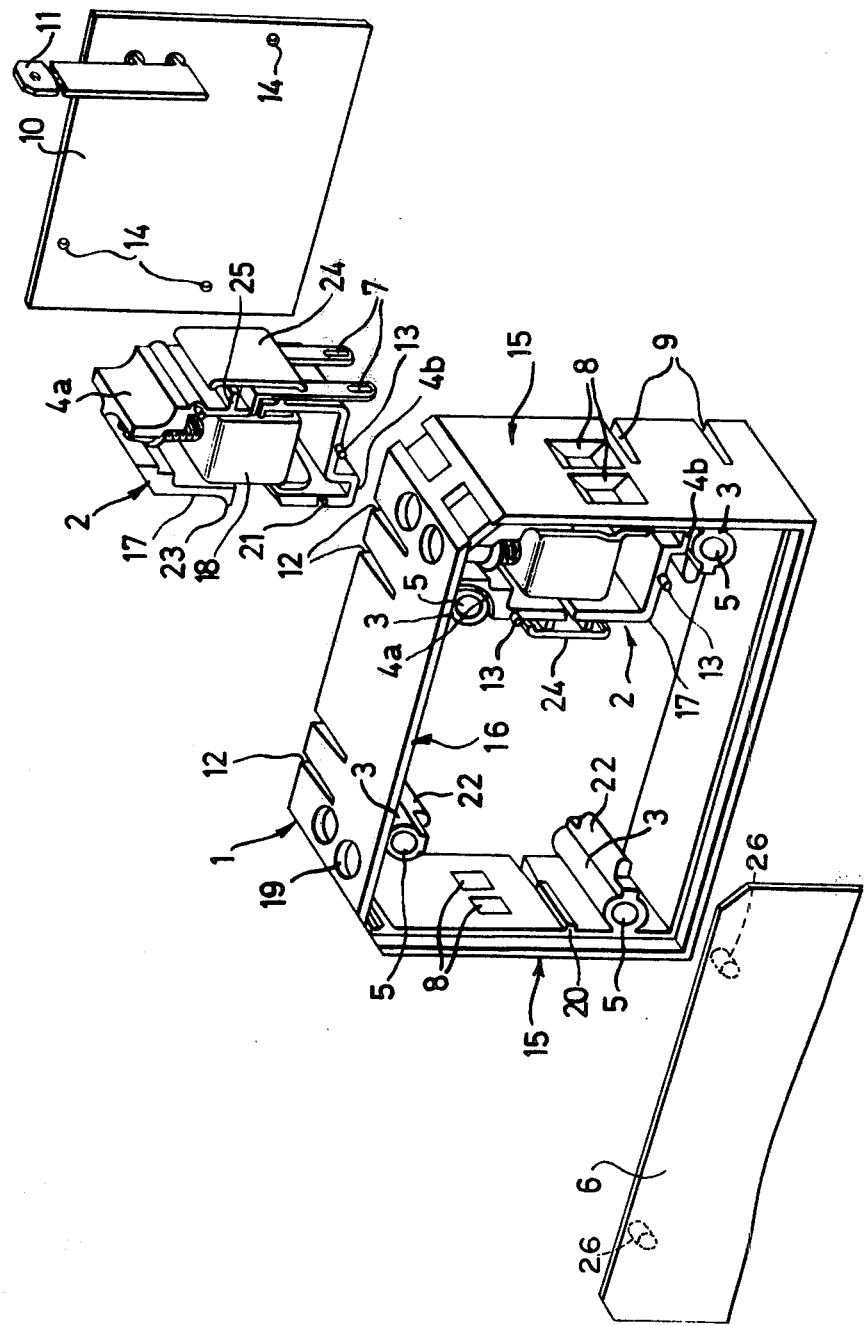

MODULAR HOUSING MEANS FOR ELECTRICAL AND ELECTRONIC COMPONENTS

This invention relates to means for housing electrical and electronic components, of the kind comprising a frame-like housing of electrically insulating material designed to be mounted in a row with other such housings, to form a modular system, the housing having an internal space in which electrical and/or electronic components can be mounted, preferably in interchangeable manner, means being provided for connecting such components to external leads.

In known housing devices of the aforesaid kind, connectors for the external leads are permanently built into the housing. In the most common arrangement, the housing is provided with built-in connecting terminals at each narrow side, through which sides access is obtained, and the internal space of the housing is designed to receive circuit boards, in particular printed circuits, with contact points which can be connected to the terminals and thereby to external leads (see for example German Patent No. 1,765,973). This arrangement has the serious disadvantage that the connection facilities cannot be adapted to particular circumstances, and to meet differing requirements it is necessary to provide a large variety of housings having different kinds of terminal built thereinto. Furthermore, in some cases not all of the terminals provided are actually needed, indeed in some cases terminals could be omitted completely, and the unnecessary terminals then take up space which could more usefully be occupied by the electrical or electronic components to be housed.

The object of the present invention is to provide modular means for housing electrical and electronic components, which will be free from the above disadvantages and in particular will be of greatly increased versatility with respect to the number, kind and location of terminals provided for connection of external leads.

According to the present invention, there is provided a housing for electrical and electronic components, comprising a generally prismatic frame-like housing member having two parallel major faces of which at least one is open and a plurality of minor faces defined by walls extending between said major faces, at least one said wall containing at least one aperture providing access to the internal space of the housing member, the housing member being provided internally with locating elements for locating releasably in plug-in manner at least one terminal unit for connecting external leads to a said component or components when housed in the housing.

The housing can be a simple, relatively thin-walled, hollow frame, which is only fitted with a terminal unit or units as and when required. The housing can therefore be left completely free of terminals if desired, thereby providing the maximum space for receiving electrical and electronic components. A plurality of interchangeable terminal units provided respectively with different types of connector or different combinations of connector types can be provided, any one or more of which can be plugged into a housing to meet particular requirements. Preferably, the housing is provided with locating elements disposed so that a plurality of terminal units can be inserted in the housing at different positions, or the position of a single terminal unit can be changed. It will be seen that, to provide a wide range of different connection facilities, it is only necessary to produce and stock a single type of housing, or a small number of housing types, together with a number of types of terminal unit which are fitted to housings as required.

The individual connection facilities provided in the terminal units can be of any desired kind, for example screw-clamping terminal sleeves, solder tags, plug pins or sockets, and wire-wrap pins. An individual terminal unit may incorporate a plurality of different types of connector.

The housing may be provided with openings for external leads, and/or for accommodating connectors of the component or components to be housed, and/or for connections forming part of a terminal unit or units. This provides greater versatility and in particular the ability to accommodate components on which connections for external leads, such as solder tags, are provided directly (thereby eliminating the need for a terminal unit).

In a preferred arrangement, at least one pair of the said locating elements is provided, each element extending internally along a said wall between and substantially perpendicular to the said major faces, the or each said pair serving to locate a respective terminal unit. Preferably, each said locating element is a generally cylindrical rib.

It is preferred that both major faces of the housing be open.

In use, the or each open face is closed by a cover plate or an adjacent modular housing, and accordingly the housings are preferably provided at their open faces with detent apertures for receiving locating projections of such cover plates or adjoining housings. Such apertures can be provided in the ends of the aforesaid cylindrical ribs.

The invention will be further described, by way of example only, with reference to the accompanying drawing, which is an exploded perspective view of a housing and two terminal units, one of which is in place in the housing.

The drawing shows a generally rectangular frame-like housing member 1 of molded electrically insulating material, for example plastic, having two parallel major faces each of which is open, and a plurality of minor faces defined by the walls of the housing member. The housing member is designed to be mounted side by side with other such members, and/or with terminal blocks of generally similar form, as part of a modular assembly. The housing member is used to accommodate electrical and/or electronic components, for example printed circuit boards, and the drawing shows a circuit board 10 which is to be housed. In use, the open faces are closed by adjacent members of said assembly or by cover plates 6.

Integral with the internal surface of each side wall 15 of the housing member is a generally cylindrical rib 3 extending between and perpendicular to the open major faces of the housing. A similar rib 3 is provided respectively adjacent to each end of the internal surface of the upper wall 16 of the housing member. The ribs are hollow, at least at their ends, thereby providing detent recesses or openings 5 in their end faces, for receiving detent pins 26 of a cover plate, or double-ended pins for securing together two adjacent housing members; the latter arrangement can be used to provide an internal space larger than that available within a single housing member.

The ribs constitute two pairs, each comprising a rib on a side wall 15 and the rib at the adjacent end of the top wall 16. Each such pair serves releasably to locate a plug-in terminal unit 2, as shown at the righthand side of the housing member in the drawing. The terminal units are thereby firmly located, with their entire side surfaces in secure engagement between the ribs 3 and the adjoining internal wall surfaces of the housing member.

Each terminal unit has a body 17 of insulating plastic material, in which are mounted electrical connectors. The terminal unit shown separate from, i.e., not yet plugged into, the housing member has solder tags 7 arranged for connection to a component or components within the housing member, and associated screw-clamping terminal sleeves 18 for connection of external leads. Alternative types of connector and connector combinations can be provided as desired, for example including plug pins and/or jacks and/or wire-wrap pins.

To provide access for external leads to screw-clamping connectors of the terminal units, each side wall 15 contains two holes 8 placed so as to be aligned with the clamping sleeves of the terminal unit when the latter is plugged in between the ribs. The top wall of the housing member has holes 19 for access to the clamping screw of such terminal units.

The housing member also has apertures 9 in the form of slits extending across the side wall from an open face of the housing member. This makes it possible to use terminal units provided with connector parts, for example solder tags or plug pins, which project out of the housing member.

The illustrated circuit board 10 has a flat connector pin 11 for direct connection to an external lead, and the housing member is also provided with openings 12 to accommodate such connectors of the housed components for direct connection to external leads; these openings 12 are also slits extending across a wall of the housing member from an open face of the latter.

The insulating bodies of the terminal units have detent pins 13 and the circuit board 10 has corresponding holes 14 which fit over the pins 13, to assist in retaining the several components together. It is therefore possible to assemble the circuit board with one or more terminal units, thereafter plugging the assembly into the housing member.

Simultaneously with the mechanical interlocking of the circuit board and terminal unit or units, solder pins extending from the terminal unit can enter holes of the circuit board. It is thereby possible for the circuit board to be fitted with the terminal unit or units and other electrical-electronic components simultaneously, and soldered in a single manufacturing step. The expensive procedure of separately soldering the terminal units to the contact paths of the circuit board is thereby eliminated.

The internal surfaces of the housing member have ribs 20 for locating flat plug pins, and mating grooves 21 are provided in the insulating bodies of the terminal units.

The cylindrical ribs 3 have shorter projecting rib portions 22 which provide bearing surfaces for the circuit board.

The bodies of the terminal units have laterally projecting ribs 23 to provide accurate location against the internal wall surfaces of the housing member and in particular to provide accurate location of the clamping sleeves relative to the holes 8.

For engaging the side surfaces of the ribs 3, the bodies of the terminal units have guide and support surfaces 4a and 4b. To protect and locate the connector strips (solder tags in the illustrated example) which extend into the clamping sleeves for clamping against an external lead, each terminal unit is provided with an insulating plate 24, secured by a rib or flange 25.

It will be understood that the pins 13 on the terminal units can also be used to engage holes or recesses in a cover plate 6.

It will readily be seen that the location, number and kind of connection facilities installed can be readily varied by variations in the location, number and form of the plug-in terminal units. If appropriate, terminal units can be omitted entirely, thereby greatly increasing the space available within the housing. Furthermore, by securing together a plurality of housing members without intervening partitions, a very large space can be provided, for example to accommodate a miniature transformer which may extend, for example, through four housing members secured together side by side. In this case, the two intermediate housing members can be left without any terminal units, each of the outermost housing members being provided at one side with a terminal unit.

It will be seen therefore that the invention is not confined to the housing of printed circuit boards and electronic components.

We claim:

1. A housing for electrical and electronic components, comprising a generally prismatic frame-like housing member having two parallel major faces of which at least one is open, and a plurality of minor faces defined by walls extending between said major faces, at least one said wall containing at least one aperture providing access to the internal space of the housing member, the housing member being provided internally with at least one pair of parallel, generally cylindrical locating ribs each extending internally along a said wall and substantially perpendicular to said major faces for locating releasably in plug-in manner at least one terminal unit for connecting external leads to a said component or components when housed in said housing, said terminal unit comprising an electrically insulating body and at least one terminal housing therein, said insulating body and at least one terminal housing therein, said insulating body being shaped to cooperate slidably with said pair of ribs, for locating said terminal unit in said housing member, said terminal unit being releasably engageable with and disengageable from the locating ribs in plug-in manner by movement of said terminal unit through said at least one open major face, and in the engaged position thereof serving to locate said at least one terminal in alignment with a said aperture, for access of at least one external conductor to said at least one terminal.

2. A housing as claimed in claim 1, having at at least one open major face means defining detent apertures for receiving locating projections of a cover plate or an adjoining housing.

3. A housing as claimed in claim 1, having detent apertures in the ends of the said ribs for receiving locating pins of a cover plate or an adjoining housing.

4. A housing as claimed in claim 1, wherein both said major faces are open.

5. A housing as claimed in claim 1, having in at least one said wall at least one hole forming a said aperture for insertion of an external conductor lead into a said terminal unit when located in the housing.

6. A housing as claimed in claim 1, having in at least one said wall at least one said aperture for receiving a said terminal of a said terminal unit with said terminal extending through said aperture.

7. A housing as claimed in claim 1, having in at least one said wall a further aperture for receiving a connection of a said component.

8. A housing as claimed in claim 1, wherein the or each said terminal unit has at least one detent element disposed for engagement with a said component.

9. A housing as claimed in claim 1, comprising a plurality of interchangeable different terminal units provided with different electrical connector means.

* * * * *